(12) United States Patent
Park et al.

(10) Patent No.: US 6,171,941 B1
(45) Date of Patent: Jan. 9, 2001

(54) METHOD FOR FABRICATING CAPACITOR OF SEMICONDUCTOR MEMORY DEVICE USING TITANIUM ALUMINUM NITRIDE AS DIFFUSION-INHIBITING LAYER

(75) Inventors: Dae-gyu Park; Sang-hyeob Lee, both of Kyunggi-do (KR)

(73) Assignee: Hyundai Electronic Industries Co., Ltd., Cheon (KR)

( * ) Notice: Under 35 U.S.C. 154(b), the term of this patent shall be extended for 0 days.

(21) Appl. No.: 09/460,388

(22) Filed: Dec. 13, 1999

(30) Foreign Application Priority Data

Dec. 24, 1998 (KR) .................................................. 98-58607

(51) Int. Cl.[7] .............................................. H01L 21/3205
(52) U.S. Cl. ............................ 438/586; 438/239; 438/396
(58) Field of Search ................................. 438/586, 658, 438/660, 666, 686, 3, 240, 396, 253, 239, 608; 437/60, 190, 235

(56) References Cited

U.S. PATENT DOCUMENTS

| | | |
|---|---|---|
| 5,231,306 | 7/1993 | Meikle et al. . |
| 5,504,041 * | 4/1996 | Summerfelt ........................ 437/235 |
| 5,525,542 | 6/1996 | Maniar et al. . |
| 5,618,746 * | 4/1997 | Hwang ................................ 438/253 |
| 5,729,054 | 3/1998 | Summerfelt et al. . |
| 5,858,851 * | 1/1999 | Yamagata et al. .................... 438/396 |
| 5,930,639 * | 7/1999 | Schuele et al. ...................... 438/396 |
| 6,025,205 * | 2/2000 | Park et al. ............................. 438/3 |

* cited by examiner

Primary Examiner—David Nelms
Assistant Examiner—Phuc T. Dang
(74) Attorney, Agent, or Firm—Oliff & Berridge, PLC

(57) ABSTRACT

A method for fabricating a capacitor of a semiconductor memory device includes forming a titanium aluminum nitride layer, satisfying $Ti_{1-x}Al_xN$, where x<1, as a diffusion inhibiting film on a platinum upper layer for forming the capacitor's upper electrode. The capacitor is fabricated by forming a first insulation layer on a substrate; forming a first platinum conductive layer on the insulation layer; forming a dielectric layer of $SrBi_2Ta_2O_9$ on the first conductive layer; forming a second platinum conductive layer on the dielectric layer; forming the titanium aluminum nitride layer on the second conductive layer; selectively etching the titanium aluminum nitride layer, the second conductive layer, the dielectric layer, and the first conductive layer, to form a capacitor pattern; annealing the etched capacitor pattern in an oxygen atmosphere; forming a second insulation layer over the annealed capacitor pattern; forming a first contact hole by selectively etching the second insulation layer, to expose an aluminum oxide layer formed on the surface of the titanium aluminum nitride layer, and forming a second contact hole by selectively etching the second insulation layer and the first insulation layer, to expose an active region of the substrate; removing the exposed portion of the aluminum oxide layer; and forming a metal interconnection to connect the second conductive layer of the capacitor and to connect the substrate, through the first and second contact holes, respectively.

15 Claims, 3 Drawing Sheets

METHOD FOR FABRICATING CAPACITOR OF SEMICONDUCTOR MEMORY DEVICE USING TITANIUM ALUMINUM NITRIDE AS DIFFUSION-INHIBITING LAYER

BACKGROUND OF THE INVENTION

1. Field of the Invention

The present invention relates to a method for fabricating a semiconductor memory device, and more particularly, to a method for fabricating a capacitor having a dielectric layer of a ferroelectric constant or a high dielectric constant, which is suitable for a high-density, high-speed memory device.

2. Discussion of the Related Art

The adoption of various ferroelectric substances for the fabrication of the capacitor dielectric in a semiconductor memory device has enabled development of large-scale memory devices without the refresh requirements of conventional DRAM devices. Among ferroelectric substances, $SrBi_2Ta_2O_9$ (SBT) has recently been the subject of active research, due to its superior fatigue strength, a favorable degree of magnetic susceptibility, and low leakage current properties.

In most cases, platinum is used for the electrodes forming the capacitor. Before and after the evaporation and etching steps for electrode formation, an annealing process is carried out to achieve crystallization and recovery, which improves the dielectric characteristics and magnetization properties of the SBT layer. The annealing process is performed several times repeatedly in a high temperature oxygen atmosphere of 800° C.

Due to the lack of a diffusion-inhibiting layer, which is a thin protective layer capable of withstanding the high temperature oxygen atmosphere of the annealing process, a non-polysilicon plug structure is frequently adopted for interconnection between the substrate and the capacitor's lower electrode.

Such a capacitor structure, however, is not without its problems. For example, to reduce the generation of a platinum residue and polymers during the etching process for forming the upper electrode of the capacitor, titanium nitride is used for the upper electrode as a hard mask, which, undesirably, oxidizes and forms a film of titanium dioxide during the annealing process for recovery of the SBT layer's characteristics after etching. Then, since the titanium dioxide forms a rough and porous surface and exhibits insulation properties, the upper electrode must be completely rid of the titanium dioxide when a contact hole is formed for metal interconnection. In addition, the poor surface conditions of titanium dioxide causes subsequent layer formations, e.g., wiring, to experience lifting when annealing and cleaning processes are performed.

Moreover, in forming the metal interconnection, titanium is deposited atop the platinum upper electrode to attain an ohmic contact between the metal interconnection and the active region of the substrate. The deposited titanium is diffused to the SBT layer and resides along a grain boundary of the platinum (upper electrode) layer, degrading the remnant polarization value of the SBT layer and reducing its fatigue strength. To resolve the diffusion problem, the metal interconnection (wiring) process needs to be performed separately, which requires additional mask fabrication and evaporation and etching steps, making the process very complicated.

Therefore, an improved method for fabricating the capacitor of a semiconductor memory device is needed.

SUMMARY OF THE INVENTION

Accordingly, an object of the present invention is to provide a method for fabricating a capacitor of a semiconductor memory device, using titanium aluminum nitride as a diffusion inhibiting layer of the upper electrode.

It is another object of the present invention to provide a method for fabricating a capacitor of a semiconductor memory device, in which a diffusion of titanium to the grain boundary of the upper electrode of the capacitor is effectively inhibited.

It is yet another object of the present invention to provide a method for fabricating a capacitor of a semiconductor memory device, in which a diffusion inhibiting layer of the upper electrode is highly resistant to high temperature and oxidation.

To achieve these and other advantages and in accordance with the purpose of the present invention, as embodied and broadly described herein, there is provided a method for fabricating a capacitor of a semiconductor memory device, the capacitor having a platinum upper layer for forming an upper electrode, the method comprising forming a titanium aluminum nitride layer, satisfying $Ti_{1-x}Al_xN$ where $x<1$, on the platinum upper layer.

Capacitor fabrication is realized by the steps of: forming a first insulation layer on a substrate; forming a first conductive layer on the insulation layer; forming a dielectric layer on the first conductive film; forming a second conductive layer on the dielectric layer; forming the titanium aluminum nitride layer on the second conductive layer; selectively etching the titanium aluminum nitride layer, the second conductive layer, the dielectric layer, and the first conductive layer, to form a capacitor pattern; performing an annealing process to the etched capacitor pattern in an oxygen atmosphere; forming a second insulation layer over the annealed capacitor pattern; forming a first contact hole by selectively etching the second insulation layer, to expose an aluminum oxide layer formed on the surface of the titanium aluminum nitride layer, and forming a second contact hole by selectively etching the second insulation layer and the first insulation layer, to expose an active region of the substrate; removing the exposed portion of the aluminum oxide layer; and forming a metal interconnection to connect the second conductive layer of the capacitor and to connect the substrate, through the first and second contact holes, respectively.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention, in which.

DETAILED DESCRIPTION OF THE PREFERRED EMBODIMENTS

The present invention is characterized in that a titanium aluminum nitride (TiAlN) layer is formed on a platinum upper electrode of a capacitor. Compared to titanium nitride, titanium aluminum nitride has satisfactory high temperature properties, i.e., greater than 200° C., and an inherent resistance to oxidation in that only a thin and uniform aluminum oxide film forms and further oxidation of the surface is delayed. In addition, because the surface of aluminum oxide is not as rough as that of titanium dioxide, subsequent process steps such as masking can be performed with less difficulty, and lifting is prevented.

Also, in forming the contact hole for metal interconnection, because aluminum oxide is selectively removed, leaving an unoxidized titanium aluminum nitride layer, the titanium of the lower layer is effectively restrained from diffusing to the grain boundary of the platinum upper electrode, so that the separate wiring process steps for metal interconnection can be eliminated and unit production costs can be reduced accordingly.

Moreover, because aluminum oxide can be dissolved by hydrofluorides, the aluminum oxide film can be removed by wet etching before the formation of the diffusion inhibiting layer, and after the contact hole is formed, without any additional etching process.

The method in accordance with the present invention will now be described in detail with reference to FIGS. 1–4.

Figure 1:
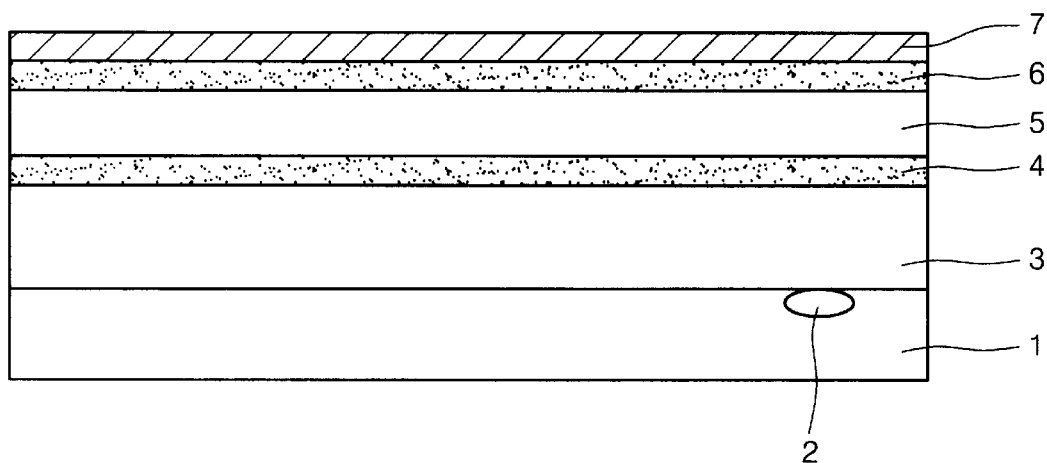
FIGS. 1–4 are sectional views illustrating process steps for fabricating a capacitor in accordance with the present invention.

As shown in FIG. 1, a first insulation layer 3 is formed on a silicon substrate 1 where an active region 2 and a corresponding word line (not shown) have been formed. A first platinum layer 4 for forming the capacitor's lower electrode, an $SrB_2TaO_9$ (SBT) layer 5, and a second platinum film 6 for forming the capacitor's upper electrode are sequentially formed on the first insulation layer 3. Then, a titanium aluminum nitride ($Ti_{1-x}Al_xN$) layer 7 is formed on the second platinum film 6, where $0.10 \leq x \leq 0.40$.

The first and second platinum layers 4 and 6 are each formed to a thickness of 1,000 Å to 3,000 Å by sputtering or using an e-beam evaporation technique, and the SBT layer 5 is formed to a thickness of 1,000 Å to 4,000 Å using a chemical vapor deposition (CVD) method. In order to crystallize the SBT material after the SBT layer 5 is formed, a rapid thermal annealing process or a furnace annealing process is performed for 30 minutes to two hours in an oxygen atmosphere at 500° C. to 900° C.

The titanium aluminum nitride layer 7 is formed to a thickness of 100 Å to 1,000 Å by sputtering or the CVD method. If formed by sputtering using a titanium aluminate ($Ti_xAl_y$) target, the target material satisfies $0.9 \geq x \geq 0.6$ and $0.1 \leq y \leq 0.4$, the applied power is 3~10 kW, and the substrate temperature is 25~550° C., with the process gases being heated argon injected at a rate of 10~30 sccm and nitrogen injected at a rate of 50~150 sccm.

Figure 2:
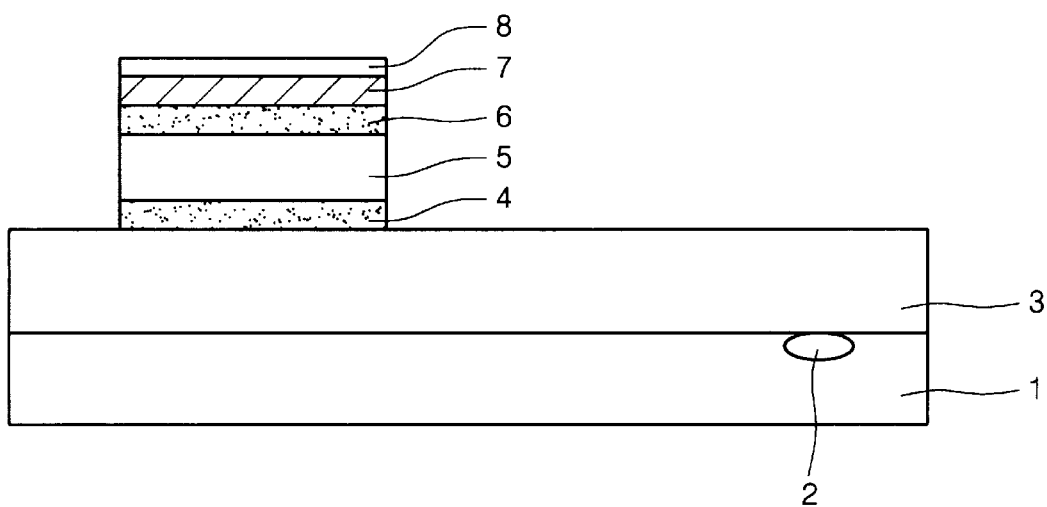

As shown in FIG. 2, the titanium aluminum nitride layer 7, second platinum film 6, SBT layer 5 and first platinum film 4 are selectively etched to form a capacitor pattern, and then an annealing process is performed to restore the SBT layer 5. At this time, an aluminum oxide film 8 forms on the surface of the titanium aluminum nitride film 7.

Figure 3:
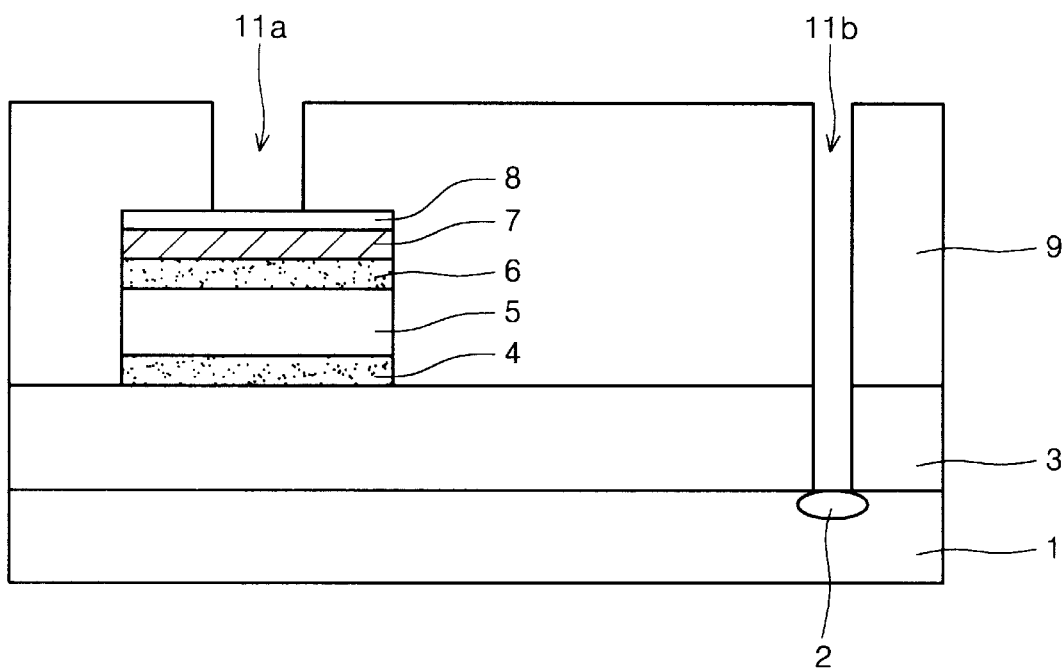

As shown in FIG. 3, a second insulation layer 9 is formed on the overall structure where the capacitor pattern is formed. A first contact hole 11a is formed, exposing a surface of the aluminum oxide film 8, by selectively etching the second insulation layer 9. A second contact hole 11b is formed, exposing the active region 2, by selectively etching the second insulation film 9 and the first insulation layer 3. The aluminum oxide film 8 exposed at the bottom of the first contact hole 11a is removed (see FIG. 4) by a dry etching method such as reactive ion etching or by a wet etching method, thereby exposing the titanium aluminum nitride layer 7. The wet etching method employs a solution of diluted hydrofluoric acid and a buffer oxidation etchant at a ratio of 100:1 to 500:1.

Figure 4:
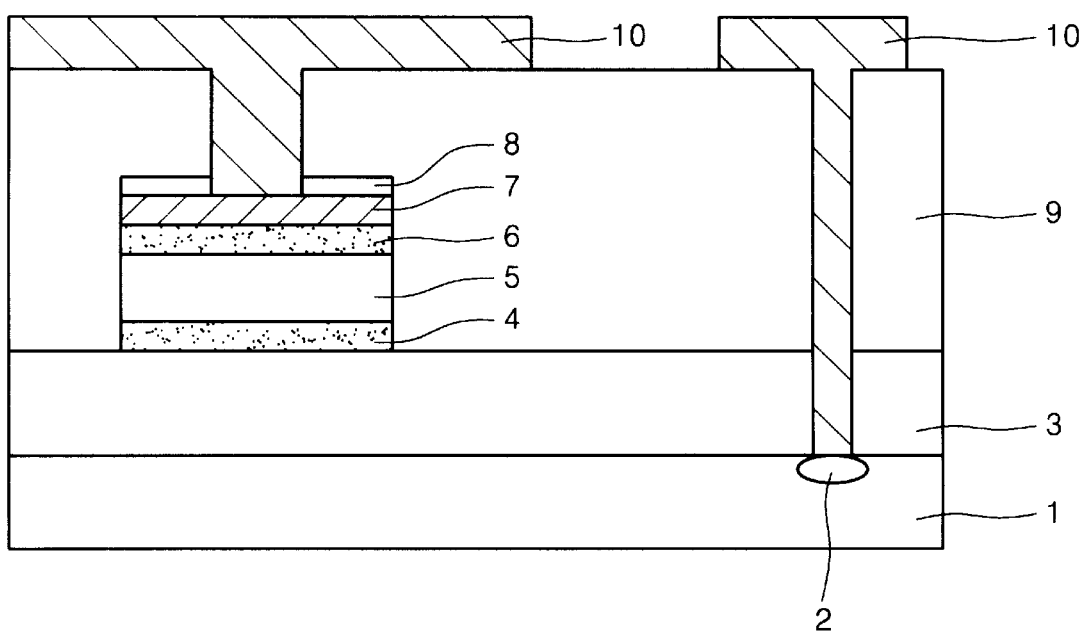

Thereafter, a diffusion inhibiting layer (not shown), made of titanium (Ti) and titanium nitride (TiN) each of which has a thickness of 300~700 Å, is formed over the structure of FIG. 3. The diffusion inhibiting layer is subjected to a selective etching to form a metal interconnection 10 as shown in FIG. 4 connected respectively to the active region 2 and the titanium aluminum nitride layer 7.

Figure 5:
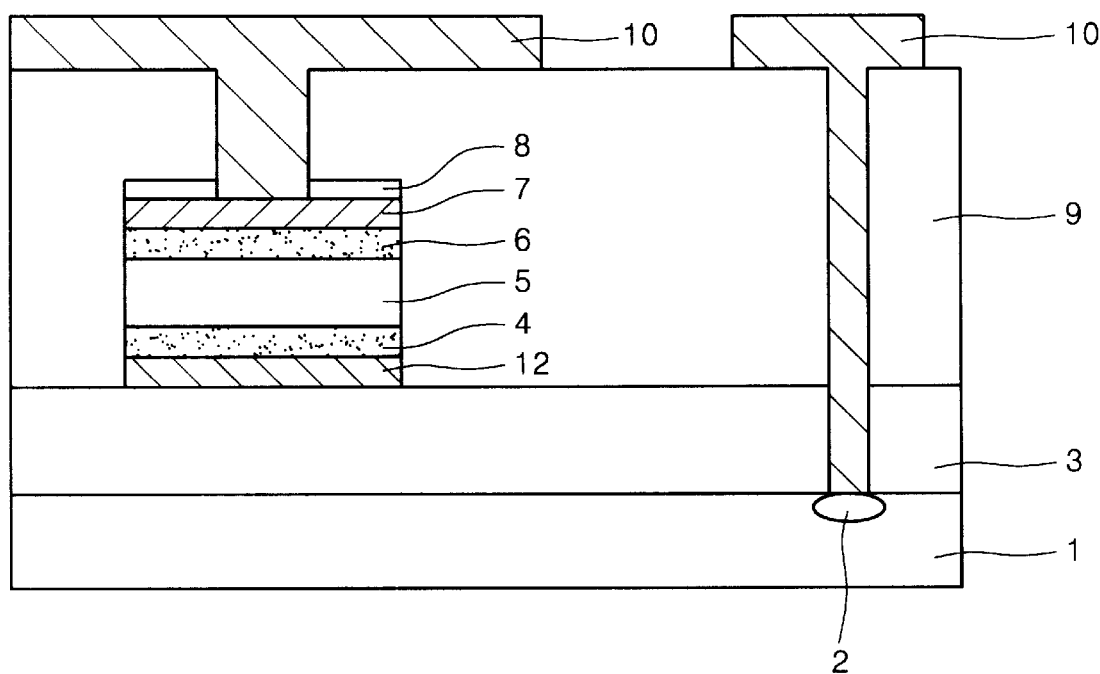
FIG. 5 is a sectional view illustrating process steps for fabricating a capacitor in accordance with another embodiment of the present invention.

Referring to FIG. 5 illustrating another embodiment of the present invention, in order to improve the adhesive force between the first platinum layer 4 and the first insulation layer 3, a titanium layer 12 is deposited directly atop the first insulation layer, i.e., before (under) the first platinum layer is formed as shown in FIG. 1. Rapid thermal annealing or furnace annealing is performed in an oxygen atmosphere of 450° C. to 550° C., thereby forming titanium oxide ($TiO_x$). Alternatively, titanium aluminum nitride may be used in place of the titanium layer 12, under the same conditions described with respect to FIG. 1 for forming the titanium aluminum nitride layer 7.

As described above, according to the present invention, by forming a titanium aluminum nitride layer as the diffusion inhibiting layer on the upper electrode of a capacitor, oxidation resistance is greatly improved, to facilitate annealing steps and thin film evaporation under an oxidation atmosphere. Also, a lifting phenomenon during subsequent layer formation steps is prevented, thereby improving reliability.

In addition, the titanium aluminum nitride film remaining on the upper electrode of the capacitor effectively inhibits diffusion of titanium, without additional processing, so that the unit cost of production is reduced.

Because the present invention may be embodied in various forms, without departing from the essential characteristics thereof, it should be understood that the above-described embodiments are not limited by any of the details of the foregoing description, unless otherwise specified, but should be construed only as defined in the appended claims. Thus, all modifications that fall within the scope of the claims are therefore intended to be embraced thereby.

What is claimed is:

1. A method for fabricating a capacitor of a semiconductor memory device, the capacitor having a platinum lower layer for forming a lower electrode and a platinum upper layer for forming an upper electrode, the method comprising forming a titanium aluminum nitride layer, satisfying $Ti_{1-x}Al_xN$, where x<1, on the platinum upper layer.

2. The method according to claim 1, wherein the capacitor comprises a dielectric layer formed of $SrBi_2Ta_2O_9$.

3. The method according to claim 1, wherein the titanium aluminum nitride layer is formed on the platinum upper layer by sputtering using a target of titanium aluminate, satisfying $Ti_xAl_y$, where $0.9 \geq x \geq 0.6$ and $0.1 \leq y \leq 0.4$, to which 3 kW to 10 kW of power is applied, wherein a substrate temperature is 25° C. to 550° C., and wherein argon and nitrogen process gases are injected at a rate of 10~30 sccm and 50~150 sccm, respectively.

4. The method according to claim 1, further comprising:
    forming an insulation layer on a substrate;
    forming the lower platinum layer, as a lower electrode of the capacitor, on the insulation layer;
    forming a dielectric layer on the lower platinum layer;
    forming the upper platinum layer on the dielectric layer; and
    selectively etching the titanium aluminum nitride layer, the upper platinum layer, the dielectric layer, and the lower platinum layer, to form a capacitor pattern.

5. The method according to claim 1, further comprising:
forming an insulation layer on a substrate;
forming a titanium oxide ($TiO_x$) layer on the insulation layer by an annealing process in an oxygen atmosphere at a temperature of 450° C. to 550° C.;
forming the lower platinum layer, as a lower electrode of the capacitor, on the titanium oxide layer;
forming a dielectric layer on the lower platinum layer;
forming the upper platinum layer on the dielectric layer; and
selectively etching the titanium aluminum nitride layer, the upper platinum layer, the dielectric layer, the lower platinum layer, and the titanium oxide layer, to form a capacitor pattern.

6. The method according to claim 1, further comprising:
forming an insulation layer on a substrate;
forming a supplemental titanium aluminum nitride layer, satisfying $Ti_{1-x}Al_xN$ where x<1, on the insulation layer, by sputtering using a target of titanium aluminate, satisfying $Ti_xAl_y$ where $0.9 \geq x \geq 0.6$ and $0.1 \leq y \leq 0.4$, to which 3 kW to 10 kW of power is applied, wherein a substrate temperature is 25° C. to 550° C., and wherein argon and nitrogen process gases are injected at a rate of 10~30 sccm and 50~150 sccm, respectively;
forming the lower platinum layer, as a lower electrode of the capacitor, on the supplemental titanium aluminum nitride layer;
forming a dielectric layer on the lower platinum layer;
forming the upper platinum layer on the dielectric layer; and
selectively etching the titanium aluminum nitride layer, the upper platinum layer, the dielectric layer, the lower platinum layer, and the supplemental titanium aluminum nitride layer, to form a capacitor pattern.

7. A method for fabricating a capacitor of a semiconductor memory device, comprising:
forming a first insulation layer on a substrate;
forming a first conductive layer on the insulation layer;
forming a dielectric layer on the first conductive film;
forming a second conductive layer on the dielectric layer;
forming a titanium aluminum nitride layer, fulfilling $Ti_{1-x}Al_xN$ where x<1, on the second conductive layer;
selectively etching the titanium aluminum nitride layer, the second conductive layer, the dielectric layer, and the first conductive layer, to form a capacitor pattern;
annealing the etched capacitor pattern in an oxygen atmosphere;
forming a second insulation layer over the annealed capacitor pattern;
forming a first contact hole by selectively etching the second insulation layer, to expose an aluminum oxide layer formed on the surface of the titanium aluminum nitride film, and forming a second contact hole by selectively etching the second insulation layer and the first insulation layer, to expose an active region of the substrate;
removing the exposed portion of the aluminum oxide layer; and
forming a metal interconnection to connect the second conductive layer of the capacitor and to connect the substrate, through the first and second contact holes, respectively.

8. The method according to claim 7, wherein the first and second conductive layers are formed of platinum.

9. The method according to claim 7, wherein the dielectric layer is formed of $SrBi_2Ta_2O_9$.

10. The method according to claim 7, comprising forming the titanium aluminum nitride film by sputtering using a target of titanium aluminate, satisfying $Ti_xAl_y$ where $0.9 \geq x \geq 0.6$ and $0.1 \leq y \leq 0.4$, to which 3 kW to 10 kW of power is applied, wherein a substrate temperature is 25° C. to 550° C., and wherein argon and nitrogen process gases are injected at a rate of 10~30 sccm and 50~150 sccm, respectively.

11. The method according to claim 7, wherein the exposed portion of the aluminum oxide layer is removed by a reactive ion etching method, thereby exposing the titanium aluminum nitride layer.

12. The method according to claim 7, wherein the exposed portion of the aluminum oxide layer is removed by a wet etching method using a solution of diluted hydrofluoric acid and a buffer oxidation etchant, mixed in the ratio of 100:1 to 500:1, thereby exposing the titanium aluminum nitride layer.

13. The method according to claim 7, comprising forming a titanium oxide ($TiO_x$) layer on the first insulation layer, by performing an annealing process in an oxygen atmosphere at a temperature of 450° C. to 550° C., to improve an adhesive force between the first conductive layer and the first insulation layer.

14. The method according to claim 7, comprising forming a supplemental titanium aluminum nitride layer, satisfying $Ti_{1-x}Al_xN$ where x<1, on the first insulation layer, by sputtering using a target of titanium aluminate, satisfying $Ti_xAl_y$ where $0.9 \geq x \geq 0.6$ and $0.1 \leq y \leq 0.4$, to which 3 kW to 10 kW of power is applied, wherein a substrate temperature is 25° C. to 550° C., and wherein argon and nitrogen process gases are injected at a rate of 10~30 sccm and 50~150 sccm, respectively, to improve the adhesive force between the first conductive layer and the first insulation layer.

15. A method for fabricating a capacitor of a semiconductor memory device, comprising:
forming a first insulation layer on a substrate;
forming a first conductive layer on the insulation layer;
forming a dielectric layer on the first conductive film;
forming a second conductive layer on the dielectric layer;
forming a titanium aluminum nitride layer, fulfilling $Ti_{1-x}Al_xN$ where x<1, on the second conductive layer, the titanium aluminum nitride film being formed by a chemical vapor deposition method;
selectively etching the titanium aluminum nitride layer, the second conductive layer, the dielectric layer, and the first conductive layer, to form a capacitor pattern;
annealing the etched capacitor pattern in an oxygen atmosphere;
forming a second insulation layer over the annealed capacitor pattern;
forming a first contact hole by selectively etching the second insulation layer, to expose an aluminum oxide layer formed on the surface of the titanium aluminum nitride film, and forming a second contact hole by selectively etching the second insulation layer and the first insulation layer, to expose an active region of the substrate;
removing the exposed portion of the aluminum oxide layer; and
forming a metal interconnection to connect the second conductive layer of the capacitor and to connect the substrate, through the first and second contact holes, respectively.

* * * * *